United States Patent [19]

Corain et al.

[11] Patent Number: 5,079,508
[45] Date of Patent: Jan. 7, 1992

[54] ELECTRIC POWER METER ADJUSTMENT AND INDICATION METHOD AND APPARATUS

[75] Inventors: Joseph N. Corain, Dover; Reginald E. Grenier, Rochester, both of N.H.

[73] Assignee: General Electric Company, Somersworth, N.H.

[21] Appl. No.: 628,132

[22] Filed: Dec. 17, 1990

[51] Int. Cl.⁵ .................. G01R 1/00; G01R 1/38; F16B 35/00
[52] U.S. Cl. .................. 324/110; 324/74; 324/154 PB; 411/393
[58] Field of Search .................. 324/110, 74, 154 R, 324/154 PB, 155, 137; 411/301, 302, 348, 393; 403/362; 310/90.5

[56] References Cited

U.S. PATENT DOCUMENTS

| | | | |
|---|---|---|---|
| 2,305,416 | 12/1942 | Hansen, Jr. ........................ | 310/90.5 |
| 2,315,408 | 3/1943 | Faus ........................ | 324/155 |
| 2,340,122 | 1/1944 | Hansen, Jr. ........................ | 310/90.5 |
| 3,645,161 | 2/1972 | Wesker ........................ | 411/393 |
| 4,617,514 | 10/1986 | Bullock et al. ........................ | 324/154 PB |

FOREIGN PATENT DOCUMENTS

| | | | |
|---|---|---|---|
| 664335 | 1/1952 | United Kingdom ........................ | 411/393 |
| 953794 | 4/1964 | United Kingdom ........................ | 411/393 |

*Primary Examiner*—Ernest P. Karlsen
*Attorney, Agent, or Firm*—Robert E. Brunson; Irving M. Freedman

[57] ABSTRACT

A method and apparatus for adjustment of the assembly of an electric power meter which rotates in response to power consumption which enables successive test positions to temporarily support the assembly without marking the bearing, and provides only a single mark on the bearing at the final factory adjustment position with an indication on the bearing of any subsequent tampering with that position.

38 Claims, 2 Drawing Sheets

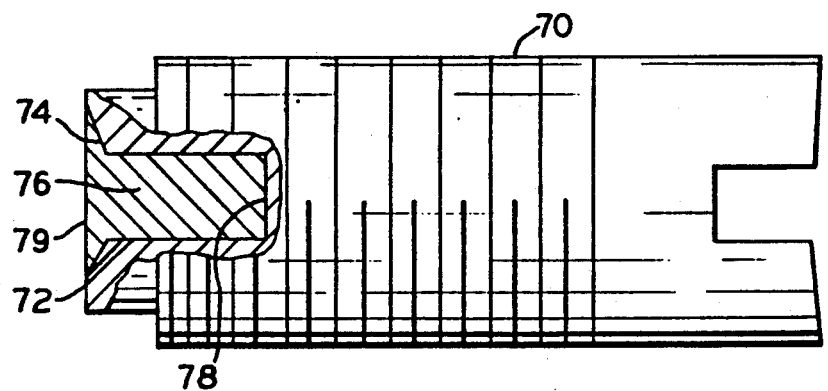
FIG_6
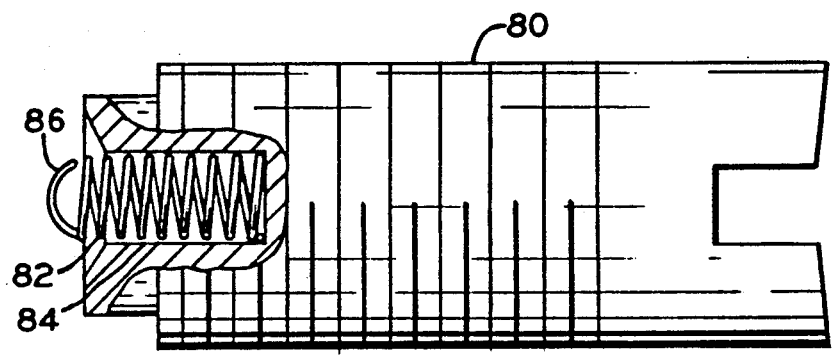
FIG_7
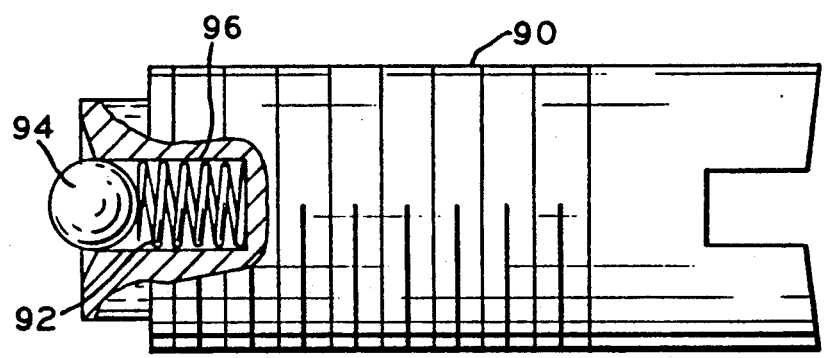
FIG_8
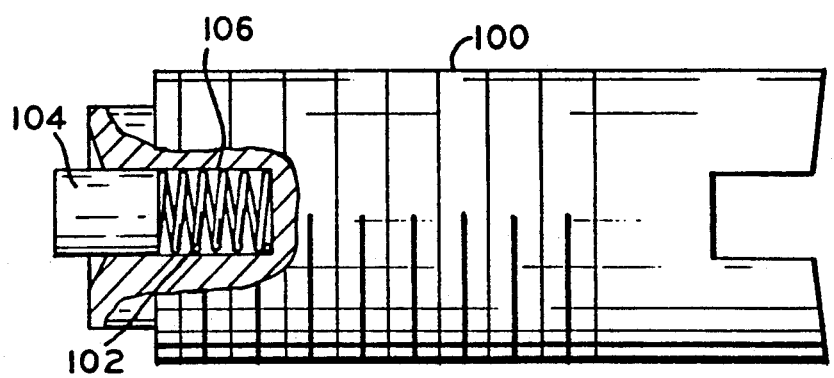
FIG_9

ELECTRIC POWER METER ADJUSTMENT AND INDICATION METHOD AND APPARATUS

BACKGROUND OF INVENTION

The present invention relates to the calibration and adjustment of electric power meters, and in particular to a method and apparatus for the adjustment of the rotatable suspension assembly of an electric power meter which will mark the factory adjustment position and will indicate any subsequent tampering with that adjustment.

Electric power meters are utilized in household and industrial applications to measure and indicate the amount of electric power consumed by the load to which the power meter is connected. Conventional electric power meters, such as induction watt hour meters, utilize a rotatably mounted eddy current disk which is subjected to a magnetic field which varies in accordance with the power consumption such that the disk rotates at a rate proportional to the power being consumed. In order to provide accurate power measurements, the suspensions for such power meters have been the subject of considerable development to minimize any friction or drag which might restrain or hinder the rotation of the disk. One method of mounting the power meter rotating disk is the use of a magnetic suspension to compensate for the weight of the disk and reduce the mechanical friction acting on, and retarding rotation of, the disk assembly. Magnetic suspensions are shown, by way of example, in U.S. Pat. Nos. 2,305,416 issued Dec. 15, 1942, to Albert Hansen, Jr.; 2,315,408 issued Mar. 30, 1943, to Harold T. Faus; and 2,340,122 issued Jan. 25, 1944, to Albert Hansen, Jr.; all of which are assigned to the same assignee as the present invention; and are incorporated herein by reference. Such magnetic suspensions employ a plurality of permanent magnets magnetized with their polar axes vertical and in axial alignment, and with the magnets arranged so that they exert a magnetic repulsion force on each other.

Any subsequent interference with the rotation of the rotatably supported eddy current disk in power meters, whether utilizing a magnetic suspension or a more conventional bearing suspension, will result in electric power usage readings which are less than the actual power consumed by the load being metered. As a result, it is not uncommon for some customers of electric power utilities to attempt to interfere with the freedom of rotation of the eddy current disk such as, for example, deliberately misadjusting the bearing system or the rotating disk to interfere with its ability to freely rotate within its bearings.

As a result, it has become important to be able to detect tampering with the eddy current disk suspension of electric power meters. Furthermore, it is important that evidence of such tampering be permanent, and adequate to be sustainable in a court of law.

OBJECTS AND SUMMARY OF INVENTION

It is an object of the present invention to provide a method and apparatus for initially adjusting the rotatable suspension of an electric power meter which will indicate any subsequent tampering.

It is another object of the present invention to provide a method and apparatus for adjusting the rotatable suspension of an electric power meter which will provide positive evidence remaining after any subsequent readjustment or tampering.

It is yet another object of the present invention to provide a method and apparatus for adjusting the rotatable suspension of an electric power meter which will show subsequent tampering, yet does not require the use of additional or specialized manufacturing or test equipment.

In a preferred embodiment of the present invention, a method of adjusting the rotatable eddy current disk suspension of an electric power meter which rotates in response to electric power consumption is provided to furnish an indication of the factory adjusted position of the bearing screw on the bearing assembly of the suspension. The rotatable suspension of the power meter and the bearing which rotatably supports the suspension are positioned on a support which includes a moveable fastening member having a deformable portion which extends beyond the fastening member toward the bearing, the fastening member is moved toward the bearing to enable the deformable portion to contact and secure the bearing on the support, the rotation of the rotatable suspension is tested to determine if the proper rotational ability is provided, the fastening member is loosened and the bearing is repositioned in the event that proper rotational ability is not provided, and the testing of the rotatable suspension is repeated. When proper rotational ability of the rotatable suspension is obtained, the fastening member is tightened with a force adequate to cause the fastening member to pass beyond the deformable portion to contact and secure the bearing in the adjusted position, while at the same time applying sufficient pressure to provide an indentation, or indication, on the surface of the bearing of the adjusted position of the bearing assembly. Any subsequent tampering with the adjusted position of bearing the will result in an additional indentation on the bearing as evidence of tampering.

More particularly, the fastening member comprises a set screw which is rotatably mounted within a threaded aperture in the support member and which includes a deformable insert positioned within an aperture extending along the axis of the set screw. The deformable member fabricated from a thermoplastic, thermoset, or thermoplastic elastomer or rubber and is secured within the set screw with an interference fit such that it can secure and support the bearing assembly within the support member during testing. Upon subsequent pressure to the set screw, the deformable member will be compressed within the opening in the set screw, the set screw will contact the soft aluminum outer surface of the bearing and provide a positive and permanent indentation or indication of the factory adjustment of the suspension system. Any subsequent tampering with that adjustment will result in a second or further indentation and indication as positive proof of tampering after the unit was adjusted at the factory. Such tampering indication is permanently applied to the bearing assembly as proof of tampering.

BRIEF DESCRIPTION OF DRAWINGS

FIGS. 6-9 show enlarged alternate embodiments of the set screw shown in FIGS. 2 and 3.

Referring to FIG. 1, a magnetic suspension 2 mounted on the support or base 16 of an electric power meter includes an eddy current disk 4 mounted on shaft 6 for rotation within bearings 8 and 10 in response to the electric power being consumed by the load being metered. A magnetic field which varies in accordance with the power being consumed by the load being metered provides a rotational torque to the eddy current disk 4 in response to the magnitude and direction of the magnetic field in a manner well known in the art. The bearings 8 and 10 are secured to the support member 16 of the electric power meter, and the eddy current disk 4 rotates within the opening 18 of the support 16, and in the gap 20 formed by support 16 about the ends of the eddy current disk.

Figure 1:
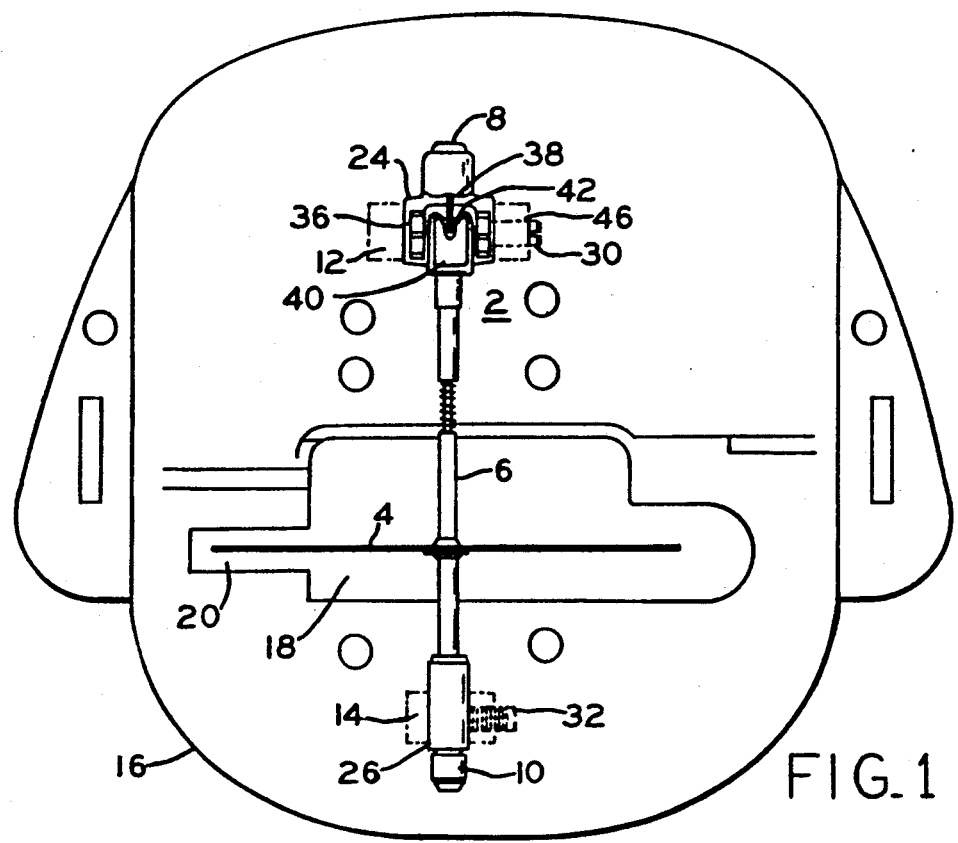
FIG. 1 shows the suspension of an electric power meter incorporating the present invention.

The bearings 8 and 10 are secured within axial openings or bores 24 and 26, within collars 12 and 14, respectively, and secured in place by the upper suspension set screw 30 and the lower guide set screw 32, respectively. The upper bearing 8 is shown as a magnetic bearing, or magnetic suspension. The lower bearing 10 may also be a magnetic suspension, but normally is merely a guide as shown in FIG. within which the shaft 6 may rotate while supported and suspended by the magnetic suspension bearing 8.

In a manner well known in the art, the magnetic suspension bearing 8 is generally cup-shaped and includes an outer suspension magnet 36 positioned about the inner surface, and a centering pin 38 extending axially downward through the center of the suspension magnet. Affixed to the upper end of shaft 6 is an inner suspension magnet 40 into which a guide bushing 42 is inserted at the upper end to provide an axial opening into which the centering pin 38 extends. The lower bearing 10 includes a simple centering pin within an axial opening arrangement similar to that provided by the centering pin 38 and guide bushing 42 of the upper bearing 8.

As shown in more detail, and described, in the aforesaid U.S. Pat. Nos., 2,305,416; 2,315,408; and 2,340,122, the rotatable eddy current disk 4 of magnetic suspension 2 is supported by, and floats within, the magnetic field formed between the outer suspension magnet 36 and the inner suspension magnet 40, to enable rotation of the disk without frictional engagement or drag on the shaft 6 which would otherwise be encountered in the normal rotation of two cooperating parts. Such an arrangement exhibits less friction than the rotational friction resulting through use of ball bearings, or other bearing surfaces designed to minimize the effects of friction and rotation.

In assembling an electric power meter of the induction watt hour type shown in FIG. 1, it is necessary to adjust and position the bearings 8 and 10 within the axial openings 24 and 26, respectively, on the support 16 in order to obtain the benefits of the essentially frictionless floating rotation required, and provided by the magnetic suspension 2. Typically, this is accomplished by moving the bearings 8 and 10 to an initial test position and securing the bearings in place by screwing the set screws 30 and 32 against the aluminum outer shells 9 and 11 of the bearings 8 and 10. The suspension is then tested to determine whether it is freely rotating without any deleterious frictional drag. If the testing indicates that further adjustment of the bearings is required, set screws 30 or 32, or both, are loosened and the bearings 8 or 10, or both, are repositioned, followed by subsequent re-testing to verify the proper positioning, and freedom of rotation, of the eddy current disk 4 of magnetic suspension 2. Once the magnetic suspension 2 is properly adjusted at the factory, there is no need for further adjustment. The set screws 30 and 32 are then securely tightened, and the support 16 subassembly is ready for further assembly into an electric power meter.

However, it has been found that some customers tamper with electric power meters in efforts to interfere with the proper rotation of the eddy current disk 4. Since the kilowatt hour digital readout mechanism is geared to the shaft 6 to indicate and totalize the number of revolutions of the shaft as an indication of power consumption by the load in circuit with the electric power meter, anything which will slow down the normal rotation of the shaft 6, or interfere with its rotation, results in lower than actual indications of power consumption. Since the charges for power consumption are normally calculated on the basis of the amount of power consumption, such tampering can result in lower, although improper, power charges. One method of tampering with electric power meters which has been observed by electric utility companies which distribute and sell electric power is the deliberate loosening of the set screws 30 and/or 32 in order to move the bearings 8 and 10 toward one another, to drive the centering pin 38 into frictional contact with the bushing 42. This deliberately creates interference with the rotation of the eddy current disk 4 and lower than actual indications or power consumption.

As a result of such tampering, electric power utilities have indicated a need for an electric power meter which will show in a positive way, in a way sustainable in a court of law if necessary, that the meter suspension has been tampered with and changed from the adjustments made at the factory. The present invention includes a method and apparatus for providing that positive indication and showing any subsequent adjustments of the rotatable suspension of the power meter after the initial factory adjustment.

Figure 2:
FIG. 2 shows the details of the set screw used to secure the suspension of FIG. 1 in the adjusted position.
Figure 3:
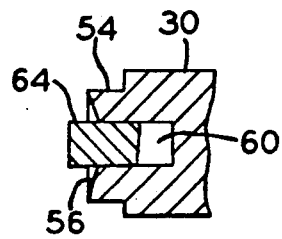
FIG. 3 is an enlarged view of a portion of FIG. 2 showing details of the end of the set screw.

In accordance with the present invention, the upper set screw 30 and lower set screw 32 are of the configuration shown in more detail in FIGS. 2 and 3. The suspension set screw 30 is shown in FIGS. 2 and 3, although the set screw 32 may be of a similar design. The set screw 30 includes a threaded portion 50 which is dimensioned for threading into threaded aperture 46 in the collar 12 of support 16. The set screw 30 also includes a slot 52 at one end thereof which is adapted to receive a conventional screwdriver, and an extension 54 of reduced diameter at the other end having a concave surface 56 (see in particular FIG. 3) and an axial bore 60 extending into the end region of the set screw adjacent the concave surface. It is to be noted that the concave surface 56 forms a cup portion in the end of the extension 54.

Securely positioned within the axial bore 60 is a resilient insert or deformable portion 64 fabricated from a thermoplastic such as Nylon, rubber, or other deformable material, and inserted into the axial slot 60 with an interference fit. The axial bore 60 in one embodiment is 0.0585 to 0.0605 inches in diameter while the resilient portion 64, which is cylindrically shaped, has a diameter of 0.065 to 0.067 inches such that the diameter of the resilient portion is greater than the diameter of the axial bore to provide the interference fit. The deformable or resilient portion 64 extends beyond the extension 54 0.022 to 0.035 inches, such that when the set screw 30 is screwed into the threaded aperture 46 in collar 12, the resilient member 64 will contact the aluminum outer surface 9 of the bearing 8, temporarily securing the bearing in place in collar 12 while preventing contact of the remainder of set screw 30 with the outer surface of the bearing. The set screw 30 is formed of an aluminum alloy, and in one embodiment has an outer diameter of 0.185 to 0.195 inches and an overall length of 0.442 to 0.460 inches, while the extension 54 has a diameter of 0.140 to 0.150 inches.

The freedom of magnetic suspension 2 to rotate is then tested, and further adjustments are made by loosening set screws 30 and 32 to reposition bearings 8 and/or 10 followed by repeated testing of the rotational freedom of the magnetic suspension.

In the existing method of adjusting and calibrating the magnetic suspension 2 without set screws of the design shown in FIGS. 2 and 3, the successive points of contact between the set screws 30 and 32 on the outer surfaces 9 and 11 of the bearings 8 and 10, respectively, would in the absence of deformable insert 64 in the set screws result in an indentation or mark on the outer surface of the bearings at each successive location of the bearings. However, in accordance with the present invention, only a single indentation or indication results from the factory adjustments and testing of the bearings 8 and 10 and the repeated tightening of their respective set screws 30 and 32 at multiple locations as described in detail below, such that any adjustment or change subsequent to the electric power meter leaving the factory will produce at least one additional indentation or indication.

In accordance with the method of adjustment of the present invention, when a set screw 30 of the type shown in FIGS. 2 and 3 is initially screwed into position and hand tightened against its bearing such as 8, the resilient insert 64 contacts the bearing to temporarily hold the bearing on the support 16 in the selected position during the testing of the freedom of rotation of magnetic suspension 2. The use of hand tightening with less than 4 inch pounds of pressure allows the manufacturing and testing personnel to make the necessary sequential adjustments and testing in the normal existing manner to determine the proper positioning of the bearings, without however marring the surface 9 of the bearing 8.

Once the proper positioning of the bearings 8 and 10 within collars 12 and 14, respectively, are determined, the set screws 30 and 32 can then be torqued using a calibrated torque tool to a force in the range of 4 to 6 inch pounds. This forces the end of the resilient insert 64 into the axial slot 60 and/or the cup portion formed by the concave surface 56 and the outer surface 9 of the bearing 8. Such additional force also drives the metal portion of the set screw 30 into contact with the surface 9 of bearing 8, and is adequate to permanently secure the bearings such as 8 and 10 in place within collars 12 and 14, respectively, on the support 16 without deforming the bearings to be out of round. Contact between the metallic portion of the extension 54 of the set screw 30 and the bearing 8 leaves a single permanent mark, or indentation, indicating the final and proper adjustment made at the factory for the magnetic suspension 2.

Any subsequent tampering or subsequent adjustment after the electric power meter leaves the factory will result in an additional mark or indentation on the aluminum outer surface of bearing 8 as positive evidence of tampering, which can be introduced into a court of law, as evidence of tampering with the suspension of the electric power meter after leaving the factory.

Figure 4:
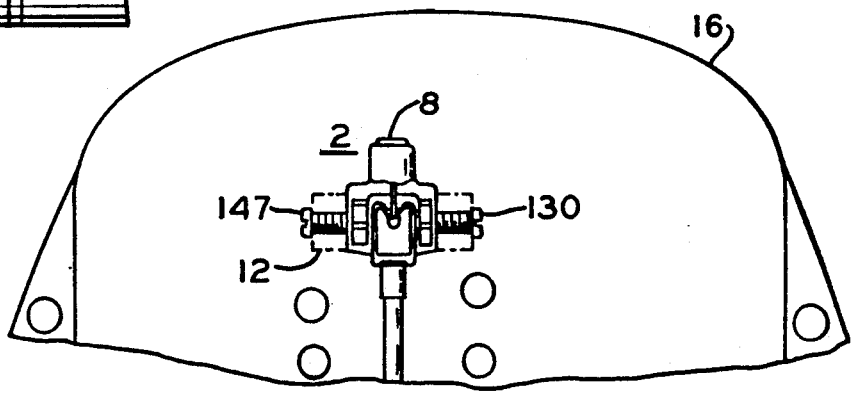
FIG. 4 shows an alternate embodiment of the present invention.
Figure 5:
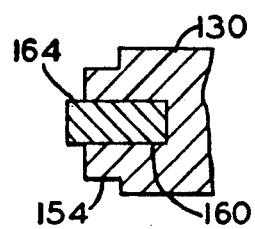
FIG. 5 is an enlarged view of a set screw used in FIG. 4.

FIGS. 4 and 5 show an alternate embodiment of the present invention. Referring to FIGS. 4 and 5, a pair of set screws 130 and 147 are supported on the support or base 16 of the electric power meter in the collar 12 to secure the bearing 8 in position. The set screw 130 is a modified version of the set screw 46. The resilient insert 164 (see FIG. 5) fills the entire axial slot 160, and is not designed to slide back into the axial slot upon final factory adjustment of the bearing 8. Set screw 130 provides a removable temporary fastener which is used during the factory adjustment procedure without providing any indentation or mark on the outer surface of the bearing 8, and is not used to permanently secure the bearing in place on support 16 of the power meter. Once the magnetic suspension 2 is properly adjusted through positioning of bearing 8, the set screw 147, which is positioned in collar 12 opposite set screw 130, is used to tighten the bearing 8 within collar 12 and upon the support 16 with sufficient force to secure the bearing and provide a permanent indentation or indication on the outer surface of the bearing. The set screw 130 may then be removed.

Alternatively, the set screw 130 could be left in place in collar 12 in the power meter to be used in the event the electric power utility company is required to readjust or recalibrate the suspension. This could be required, for example, if the meter were removed from use for repair or recalibration because of problems or damage encountered in use. Under such conditions, the temporary set screw 130 could be utilized as in the factory, and a record kept to indicate that a second calibration had been accomplished on the particular meter, and the identifying serial number would be recorded to indicate that as a result, there were now two indentations or marks on the bearing 8. However, the embodiment shown in FIGS. 1-3 includes the advantage of not requiring any modification of existing power meter designs, or changes in adjustment and calibration procedures, and does not require an additional screw and threaded aperture.

FIGS. 6-9 show alternate embodiments of the set screw 30 shown in FIGS. 2 and 3. Referring to FIG. 6, the resilient insert or deformable portion 76 is shown in the final position after adjustment of the magnetic suspension 2 of the electric power meter. In the embodiment shown in FIG. 6, the resilient insert 76 is shown positioned within an axial bore 72 which is shorter than the length of the insert. In the final adjusted position, the insert 76 has been driven against the inner end 78 of the axial bore 60 such that the opposite or outer end of the insert is compressed, or mushroomed out, to fill the cup or concave cavity formed by the concave surface 74 at the open end of the axial bore 72. Such an arrangement does not require close dimensions to provide the desired interference fit between the insert 76 and the axial bore 72. The insert is initially assembled with its inner end contacting the inner end surface 78, and its outer resilient end 79 temporarily holding the bearings such as 8 and 10 in position during the calibration procedure without providing an indentation or mark on the outer surface of the bearings. When proper positioning of the bearings 8 and 10 is attained, the additional torque or force is provided to drive the metal portion of the set screw 70 into contact with the surface 9 of the bearing to permanently secure the bearings in place within collar 12 on support 16, while at the same time compressing the outer end of the insert into the cup formed by the concave surface 74 and providing an indentation or mark on the outer surface 9 and/or 11 of the bearings 8 and 10, respectively.

Referring to FIG. 7, an alternate embodiment of the set screw 80 includes a coil spring 82 positioned within the axial bore 84 with a rounded outer end 86 extending beyond the axial bore. The coil spring 82 may be fabricated from metal bearing a nonmetallic coating of plastic or rubber, or alternatively may be constructed of a nonmetallic material such as a resilient plastic. The specific material is selected to provide the required or desired compression and resiliency characteristics to provide the temporary and permanent positioning action described above.

FIG. 8 shows a further embodiment of a set screw 90 utilizing a spring loaded ball 94 at the open end of the axial bore 96 with a coil spring 92 positioned within the axial bore and providing the desired resiliency to the ball 94. The ball 94 may be fabricated of an appropriate plastic or rubber and may be secured to the outer end of the coil spring. The combination ball 94 and coil spring 92 provide a deformable member providing the desired resiliency which operates in the manner described above in connection with FIGS. 2 and 3, and which cooperate to provide the equivalent of the deformable member 64 shown in FIG. 3.

Referring next to FIG. 9. FIG. 9 shows another alternate embodiment of a set screw 100 which includes a coil spring 102 within the axial bore 106 which provides the desired resiliency to the insert 104. The spring-loaded insert 104 may conveniently be fabricated of a deformable plastic or rubber, and is slidable within the axial bore 106 upon the application of adequate pressure during the permanent positioning of the calibrated magnetic suspension 2 in the manner described above in connection with FIGS. 1-3 and 6-8.

It is to be noted that the present invention does not require the use of any special tooling or test equipment, nor require the special or additional training of personnel in the assembly and testing of induction watt hour meters. In addition, the present invention does not require any redesign of the power meter support member 16. While the present invention has been shown in connection with a magnetic suspension for a power meter, it is equally applicable to more conventional bearing types of suspensions such as those utilizing jewel bearings. While the present invention has been described with respect to certain preferred embodiments thereof, it is to be understood that numerous variations in the details of construction, the arrangement and combination of parts, and the type of materials used may be made without departing from the spirit and scope of the invention.

What we claim is:

1. A method of adjusting an electric power meter rotatable suspension in which the suspension rotates in bearings in response to electric power consumption to provide an indication of the factory adjusted position on the bearing which supports the rotatable suspension comprising the steps of:

positioning said rotatable suspension and said bearings on a support member which includes a fastener having a resilient portion extending beyond said fastener toward at least one of said bearings;

moving said fastener into contact with the one bearing to enable said resilient portion to secure said bearing on said support;

testing the rotational ability of said rotatable suspension about said bearing;

loosening said fastener, repositioning the bearing in the event that the proper rotational ability of said rotatable suspension is not provided, and repeating said testing of said rotatable suspension;

tightening said fastener against the one bearing when proper rotational ability of said rotatable suspension is obtained to cause said fastener to pass beyond said resilient portion to directly contact and secure said bearing; and applying sufficient force to said fastening member to provide a permanent indication on the surface of said bearing of the final adjusted position of said bearing on said support member.

2. The method of adjusting the rotatable suspension of an electric power meter as set forth in claim 1 wherein said support includes a threaded aperture and said fastening member is a set screw, and wherein said set screw is positioned within said threaded aperture, and is moved into contact with said bearing by rotating said set screw.

3. The method of adjusting the rotatable suspension of an electric power meter as set forth in claim 1 wherein said rotatable suspension includes a rotatable eddy current disk, and the additional step of providing a magnetic field to said rotatable disk to cause said disk to rotate in response to power consumption being metered by said power meter.

4. The method of adjusting the rotatable suspension of an electric power meter as set forth in claim 2 wherein said resilient portion is a substantially cylindrical insert within an axial bore in said set screw, and sufficient force is applied to the rotation of said set screw to force said resilient portion into said axial opening in said set screw to enable said set screw to directly contact said bearing.

5. The method of adjusting the rotatable suspension of an electric power meter as set forth in claim 1 wherein said resilient portion is selected from the group consisting of deformable plastic and rubber.

6. The method of adjusting the rotatable suspension of an electric power meter as set forth in claim 3 wherein said resilient portion is substantially cylindrical in shape and is secured within an axial opening within the central region of said set screw with an interference fit, and forcing said resilient portion into said axial opening only upon the application of sufficient force on said set screw to overcome said interference fit.

7. The method of adjusting the rotatable suspension of an electric power meter as set forth in claim 6 wherein moving said resilient portion into contact with said bearing does not mar the surface of said bearing and does not provide any indication of the various test positions used in adjusting said rotatable suspension prior to the application of said sufficient force.

8. The method of adjusting the rotatable suspension of an electric power meter as set forth in claim 7 wherein subsequent adjustment of said rotatable suspension after said sufficient force has been applied will provide another indication on said bearing.

9. The method of adjusting the rotatable suspension of an electric power meter as set forth in claim 8, including the additional step of inspecting the surface of said bearing to determine if there is more than one indication on said bearing as an indication of tampering with the rotatable suspension of said power meter.

10. The method of adjusting the rotatable suspension of an electric power meter as set forth in claim 6 wherein said sufficient force is measured through use of a force indicator attached to a tool to rotate said set screw toward said bearing in order to ensure said sufficient force provides an indication by way of marking the surface of said bearing, and secures said bearing in position on said support member without significantly deforming said bearing.

11. The method of adjusting the rotatable suspension of an electric power meter as set forth in claim 10 wherein said marking is the circular indentation of said set screw on the outer surface of said bearing.

12. The method of adjusting the rotatable suspension of an electric power meter as set forth in claim 11 wherein at least the outer surface of said bearing is fabricated from an aluminum material.

13. The method of adjusting the rotatable suspension of an electric power meter as set forth in claim 3 wherein said bearing includes a magnetic suspension and wherein the positioning of said bearing and said testing is provided to ensure proper magnetic suspension of said rotatable suspension.

14. The method of adjusting the rotatable suspension of an electric power meter as set forth in claim 1 wherein said resilient portion includes a spring, and said spring is compressed into said axial opening upon application of said sufficient force.

15. A method of adjusting the rotatable suspension of an electric power meter as set forth in claim 1 wherein the force applied when moving said fastener to contact said bearing for testing is less than 4 inch pounds, and the force applied to tighten said fastening member against said bearing is in the range of 4-6 inch pounds.

16. A suspension for an electric power meter disk which rotates in at least one bearing in response to electric power consumption by the load being metered by the power meter comprising:
   a support member on which the bearing for said suspension is secured;
   said support member including a threaded aperture proximate to said bearing;
   a set screw threaded in said aperture to secure said bearing on said support member when said bearing is properly positioned for rotation in response to said electric power consumption; and
   said set screw including a resilient portion which extends beyond the remainder of said set screw in said threaded aperture toward said bearing such that said resilient portion contacts and temporarily secures said bearing on said support member during the testing and trial positioning of said suspension;
   said resilient portion being bypassed by said remainder of said set screw upon the further rotation of said set screw when the final position of said bearing assembly on said support member is determined;
   said bearing including an outer surface region adjacent said set screw and said set screw contacting, securing and providing a single indentation mark on said outer surface of said bearing through said further rotation of said set screw to said final position; and
   said single indentation mark being indicative of the final factory adjustment position for said bearing, such that any other indentation mark on said outer surface is indicative of possible tampering with the power consumption information provided by said electric power meter.

17. The electric power meter rotatable suspension of claim 16 wherein the suspension is a magnetic suspension provided at one end thereof, and said set screw is provided to secure said magnetic suspension to said support member.

18. The electric power rotatable meter suspension of claim 16 wherein said resilient portion of said set screw is substantially cylindrical in shape and is positioned within an axial bore within the end of said set screw proximate to said bearing.

19. The electric power meter rotatable suspension of claim 18 wherein said resilient portion is deformable plastic secured in said axial bore with an interference fit such that said resilient portion is capable of temporarily securing said bearing in position on said support member with said deformable plastic secured in place in said axial bore upon the application of a first rotational force to said set screw, and is forced into said axial bore upon the application of a greater force to said set screw.

20. The electric power meter rotatable suspension of claim 18 wherein said resilient portion is an elastomer secured in said axial opening with an interference fit such that said resilient portion is capable of temporarily securing said bearing in position on said support member with said rubber secured in place in said axial bore upon the application of a first rotational force to said set screw, and is forced into said axial bore upon the application of a greater force to said set screw.

21. The electric power meter rotatable suspension of claim 18 wherein said set screw is secured against said outer surface of said bearing with a force which does not substantially deform the shape of said outer surface.

22. The electric power meter rotatable suspension of claim 18 wherein said set screw includes a concave surface, the periphery of which contacts said outer surface of said bearing in said final position of said set screw.

23. The electric power meter rotatable suspension of claim 17 wherein said set screw is secured within a threaded aperture in said support member.

24. The electric power meter rotatable suspension of claim 19 wherein said interference fit and said deformable plastic enables temporarily securing said bearing with a force of up to 4 inch pounds by said set screw, and said greater force is in the range of 4-6 inch pounds.

25. The electric power meter rotatable suspension of claim 20 wherein said interference fit and said elastomer enables temporarily securing said bearing with a force of up to 4 inch pounds by said set screw, and said greater force is in the range of 4-6 inch pounds.

26. A suspension for an electric power meter disk which rotates in at least one bearing in response to electric power consumption by the load being metered by the power meter comprising:
   a support member on which the bearing for said suspension is secured;
   said support member including at least two threaded apertures proximate to said bearing;
   a first set screw in a first of said at least two threaded apertures and including a resilient portion which extends beyond the remainder of said first set screw toward said bearing, such that said resilient portion contacts and temporarily secures said bearing on said support member during the trial positioning and testing of said suspension;

a second set screw in a second of said at least two threaded apertures to contact and secure said bearing on said support member after said bearing is properly positioned for proper rotation of said suspension in response to said electric power consumption;

said bearing including an outer surface which said second set screw contacts to provide a single indentation mark on said outer surface of said bearing; and said single indentation mark being indicative of the factory adjustment position for said bearing such that any other indentation mark is indicative of possible tampering with the readings provided by said electric power meter.

27. The electric power meter suspension of claim 26 wherein such suspension is a magnetic suspension provided at one end thereof.

28. The electric power meter suspension of claim 27 wherein said resilient portion of said set screw is substantially cylindrical in shape and is positioned within an axial opening within the end of said set screw proximate to said bearing.

29. The electric power meter suspension of claim 16 wherein said resilient portion includes a compressible spring.

30. The electric power meter suspension of claim 29 wherein said axial opening is a bore in one end of said set screw, and a screw driver slot is positioned in the opposite end of said set screw.

31. The electric power meter suspension of claim 29 wherein said resilient portion further includes an insert positioned within the open end of said bore adjacent to said compressible spring.

32. The electric power meter suspension of claim 31 wherein said insert is nonmetallic.

33. The electric power meter suspension of claim 32 wherein said insert is selected from the group consisting of plastic and rubber.

34. The electric power meter suspension of claim 30 wherein said insert is secured to said compressible spring.

35. The electric power meter suspension of claim 16 wherein said resilient portion is a compressible spring having a curved portion extending out of the open end of said bore.

36. The electric power meter suspension of claim 35 wherein said compressible spring is a coil spring including a nonmetallic outer surface.

37. The electric power meter suspension of claim 36 wherein said nonmetallic outer surface is selected from the group consisting of plastic and rubber.

38. The electric power meter suspension of claim 16 wherein said resilient portion is positioned in an axial bore, said axial bore including a concave opening extending from its open end, and said deformable member substantially filling said axial bore, such that said further rotation forces the end of said deformable member adjacent said open end into said concave opening.

* * * * *